United States Patent
Sunaga et al.

(10) Patent No.: US 7,843,742 B2
(45) Date of Patent: Nov. 30, 2010

(54) METHOD OF CONTROLLING MEMORY AND MEMORY SYSTEM THEREOF

(75) Inventors: Toshio Sunaga, Ontsu (JP); Norio Fujita, Shiga-ken (JP)

(73) Assignee: International Business Machines Corporation, Armonk, NY (US)

( * ) Notice: Subject to any disclaimer, the term of this patent is extended or adjusted under 35 U.S.C. 154(b) by 359 days.

(21) Appl. No.: 11/996,544

(22) PCT Filed: Jul. 26, 2006

(86) PCT No.: PCT/JP2006/314735

§ 371 (c)(1),
(2), (4) Date: Jan. 23, 2008

(87) PCT Pub. No.: WO2007/013491

PCT Pub. Date: Feb. 1, 2007

(65) Prior Publication Data

US 2010/0061156 A1    Mar. 11, 2010

(30) Foreign Application Priority Data

Jul. 29, 2005   (JP)   ............................. 2005-220445

(51) Int. Cl.
    *G11C 7/10* (2006.01)
(52) U.S. Cl. ............................. 365/189.05; 365/189.07; 365/230.08; 365/189.04
(58) Field of Classification Search ............ 365/189.05, 365/189.07, 230.08, 189.04
    See application file for complete search history.

(56) References Cited

U.S. PATENT DOCUMENTS 5,515,325 A    5/1996   Wada
5,912,847 A    6/1999   Tamaki
6,085,300 A    7/2000   Sunaga et al.
6,144,616 A    11/2000  Suzuki et al.
6,252,794 B1   6/2001   Sunaga et al.
6,359,813 B1 * 3/2002   Uchida et al. ........... 365/189.05
6,427,197 B1   7/2002   Sato et al.

(Continued)

FOREIGN PATENT DOCUMENTS

JP    7182870 A    7/1995

(Continued)

*Primary Examiner*—Huan Hoang
(74) *Attorney, Agent, or Firm*—Yuanmin Cai

(57) ABSTRACT

The present invention relates to a memory system including a memory cell array and being connected to an address input, a command input, and a data input/output, said memory system including latching circuits (RALTH and WALTH) for latching a read address and a write address being inputted from the address input, an address selection circuit (ACOMSEL) for selecting, as an access address, any one of the read address and the write address being latched in the latching circuits, a read latching circuit (PFLTH) for latching a read data being read from the memory cell array, a write latching circuit (DINLTH) for latching a write data being inputted from the data input/output and a control circuit (ACTL) for controlling the access address being selected by said address selection circuit in response to a command being inputted from said command input, said control circuit for controlling, if the memory cell corresponding to said selected access address is activated and further said selected access address is a write address, a timing of writing the write data being latched by said write latching circuit into the activated memory cell.

16 Claims, 10 Drawing Sheets

U.S. PATENT DOCUMENTS

| | | |
|---|---|---|
| 2001/0036116 A1 | 11/2001 | Kubo et al. |
| 2002/0018394 A1 | 2/2002 | Takahashi |
| 2002/0078294 A1 | 6/2002 | Tsuchida et al. |
| 2002/0141266 A1 | 10/2002 | Sunaga et al. |
| 2003/0147298 A1* | 8/2003 | Ooishi et al. ................ 365/233 |
| 2004/0174727 A1 | 9/2004 | Park |
| 2004/0206981 A1 | 10/2004 | Gross et al. |

FOREIGN PATENT DOCUMENTS

| | | |
|---|---|---|
| JP | 10111828 A | 4/1998 |
| JP | 11045567 A | 2/1999 |
| JP | 2000137983 A | 5/2000 |
| JP | 2000163969 A | 6/2000 |
| JP | 2000260178 A | 9/2000 |
| JP | 2000306379 A | 11/2000 |
| JP | 2002056676 A | 2/2002 |
| JP | 2002358783 A | 12/2002 |

* cited by examiner

METHOD OF CONTROLLING MEMORY AND MEMORY SYSTEM THEREOF

REFERENCE TO RELATED APPLICATIONS

The present application claims the benefit of priority of an International Patent Application PCT/JP2006/314735 filed Jul. 26, 2006 which in turn claims benefit of priority of a Japanese Patent Application No. 2005-220445, filed Jul. 29, 2005, both with the Japan Patent Office, the content of which are incorporated herein by reference in their entireties.

FIELD OF THE INVENTION

The present invention relates, in generally, to a memory architecture, and more particularly, to a memory system for improving a cycle time in a memory and a data rate in a data input/output (I/O), and a control method thereof.

BACKGROUND OF THE INVENTION

A PSRAM using a DRAM as a basic configuration thereof has been widely used, on behalf of a conventional SRAM, in a device such as a cellular phone wherein low consumption current and large volumes of memory (32 Mb to 128 Mb) are required. In a PSRAM, an increase in speed as well as low current consumption at the time of stand-by and activation (operation) have recently become important elements along with an improvement in functions and performances of a device to be used. For example, in an asynchronous system for an SRAM-compliant interface, a page mode with a cycle time of 15 ns to 20 ns has been introduced, and further, with the aim of further increase in speed, a synchronous system such as a SDRAM has, in general, begun to be adopted. In this synchronous system, writing and reading according to a burst mode for 8 or 16 words are performed with clocks of 75 MHz to 100 MHz or more.

Meanwhile, according to a requirement of a device in use, there is, in a writing system, a single write system in which only one word is written, in addition to the burst mode. By switching a programmable mode register or the like, either the burst write or the single write is selected depending on an operation of a device. Since the single write system writes only one word, the operation thereof is basically unfit for an increase in speed. In case of reading, since the burst mode with 8 or 16 words is the only system to be used, the velocity of a single write is considerably slower than that of a burst read.

Further, the more important point is that once entering into a single write mode, there is a large loss of time for switching to and from a read mode. The result is that an access cycle time including the single write of a memory grows longer. Moreover, even if an increase in speed can be achieved by using a burst read with a long number of word, in case of combining the burst read with a single write, an average data rate on data input/output becomes much lower than a maximum data rate (theoretical value) to be determined by multiplying clock frequency by a data bus width.

FIG. 1 is a schematic view showing a brief description of reading and writing operations in a conventional typical synchronous PSRAM. In FIG. 1, read latency is set as 5 clock cycles, and write latency is set as 4 clock cycles. A CLK represents a clock and a CMD represents an access command signal. A CMD-R and a CMD-W represent a read command and a write command, respectively. With a low CMD, either a reading or writing operation starts. An ATC stands for an "Array Time Constant" and means a series of memory array activation processes from decode of an address being downloaded together with the CMD clock to an increase in potential of a word line, on operation (driving) of a sense amplifier, re-reading, off operation of the word line, off operation of the sense amplifier, and pre-charge for a bit line. Data I/O represents a data input and output.

There is also an alternative write enable (WE) signal, not depicted in FIG. 1. When the CMD is low, if the WE is simultaneously high, a reading operation starts, and if the WE is low, a writing operation starts. In addition, in FIG. 1, any address is not depicted either, however, an address is downloaded together with the CMD clock and an access to a cell specified by the address is performed. The first CMD-R1 is for reading and is decoded after the address being downloaded together with the CMD-R1 passed through an address bus. Thereafter, an array is activated and 8-word burst data comes up on the data I/O from the fifth clock at CMD-R1.

In FIG. 1, for reading data, it is assumed to use a Prefetch system for burst read. After the sense amplifier is turned on, a burst data with 8 words per an I/O is temporarily stored in a latching circuit (not being illustrated) that is one of peripheral circuits from a memory cell through a bit switch (not being illustrated). Therefore, since a memory array can be pre-charged right after data is prefetched, the ATC can be completed in a fairly short amount of time. In a typical PSRAM, the next access command is entered into the second clock from the last data for burst read. In FIG. 1, the CMD-W1 for writing of a single write is inserted at this timing. After the same period of time as that for reading, the memory array is activated from the CMD-W1 during the ATC-W1. The write data being entered in the data I/O at the fourth clock from the CMD-W1 is written into the memory cell.

FIG. 1 illustrates operations wherein the similar reading and writing are repeated below. In the data I/O, the data is used in series only at the time of the burst, however, the data is discontinued due to switching between reading and writing operations. One cycle required for a set of reading and writing (single write) takes 21 clocks, however, 9 clocks of the data I/O are only used. Therefore, the usage rate of the data I/O is only 43% (9/21). Hence, an average data rate on the data I/O of a cycle is also only 43% that is a theoretical maximum value. As stated above, in a normal PSRAM, there is a large decrease in a data rate in reading and writing operations including a single write mode.

Related prior art documents include, for example, Japanese Unexamined Patent Publication (Kokai) No. 3362775. This publication discloses an art for improving a data transfer rate of a DRAM. However, the invention being disclosed in this publication targets a burst access in case that reading and writing have the same burst length and a low address changes, and is not an invention for enabling to improve a cycle time and a data rate in various access cycles including a single write.

SUMMARY OF THE INVENTION

It is an objective of the present invention to reduce an access cycle time and to improve a data rate in a data input/output (I/O) in a single writable memory.

It is another objective of the present invention to achieve an increase in speed of a memory access including a single write mode.

The present invention relates to a method of controlling a memory, the memory including a memory cell array and being connected to an address input and a data input/output, the method comprising the steps of receiving a read address from the address input, receiving a write address from the address input, latching a single write data to be written into said write address from the data input/output, activating a memory cell corresponding to the read address, outputting the read data from the activated memory cell to the data input/output, activating a memory cell corresponding to the write address while outputting the read data to the data input/output, and writing the latched single write data into the activated memory cell corresponding to the write address.

The present invention relates to a method of controlling a memory, the memory including a memory cell array and being connected to an address input and a data input/output, the method containing the steps of receiving a write address from the address input, latching a single write data to be written into the write address from the data input/output, receiving a read address from the address input, activating a memory cell corresponding to the read address, outputting read data from the activated memory cell to the data input/output, activating the memory cell corresponding to the write address while outputting the read data to the data input/output, and writing the latched single write data into the activated memory cell corresponding to the write address.

The present invention relates to a method of controlling a memory, the memory including a memory cell array and being connected to an address input and a data input/output, the method containing the steps of receiving a first write address from the address input, latching first single write data to be written into the first write address from the data input/output, activating a memory cell corresponding to the first write address, receiving a second write address from the address input, latching second single write data to be written into the second write address from the data input/output, writing the latched first single write data into the activated memory cell corresponding to the first write address, activating the memory cell corresponding to the second write address, and writing the latched second single write data into the activated memory cell corresponding to the second write address.

The present invention relates to a memory system including a memory cell array and being connected to an address input, a command input, and a data input/output, the memory system including a latching circuit for latching a read address and a write address inputted from the address input, an address selection circuit for selecting, as an access address, either the read address or the write address being latched by the latching circuit, a read latching circuit for latching read data being read from the memory cell array, a write latching circuit for latching write data being inputted from the data input/output, and a control circuit for controlling the access address being selected by the address selection circuit in response to a command being inputted from the command input, the control circuit for activating the memory cell corresponding to the selected access address, and further when the selected access address is a write address, controlling a timing of writing the write data being latched by the write latching circuit into the activated memory cell.

According to embodiments of the present invention, in a memory, since a single write access can be immediately executed after a read access, access cycle time including the single write can be reduced and a data rate in a data input/output can be improved.

According to embodiments of the present invention, in the memory, since the read access can be immediately executed after the single write access, the access cycle time including the single write can be reduced and the data rate in the data input/output can be improved.

According to embodiments of the present invention, in the memory, since the single write access can be repeated in a short period of time, the access cycle time including the single write can be reduced and the data rate in the data input/output can be improved.

According to embodiments of the present invention, in all access modes including the single write access, the speed of the memory access operation can be improved.

DETAILED DESCRIPTION OF EMBODIMENTS OF THE INVENTION

Figure 1:
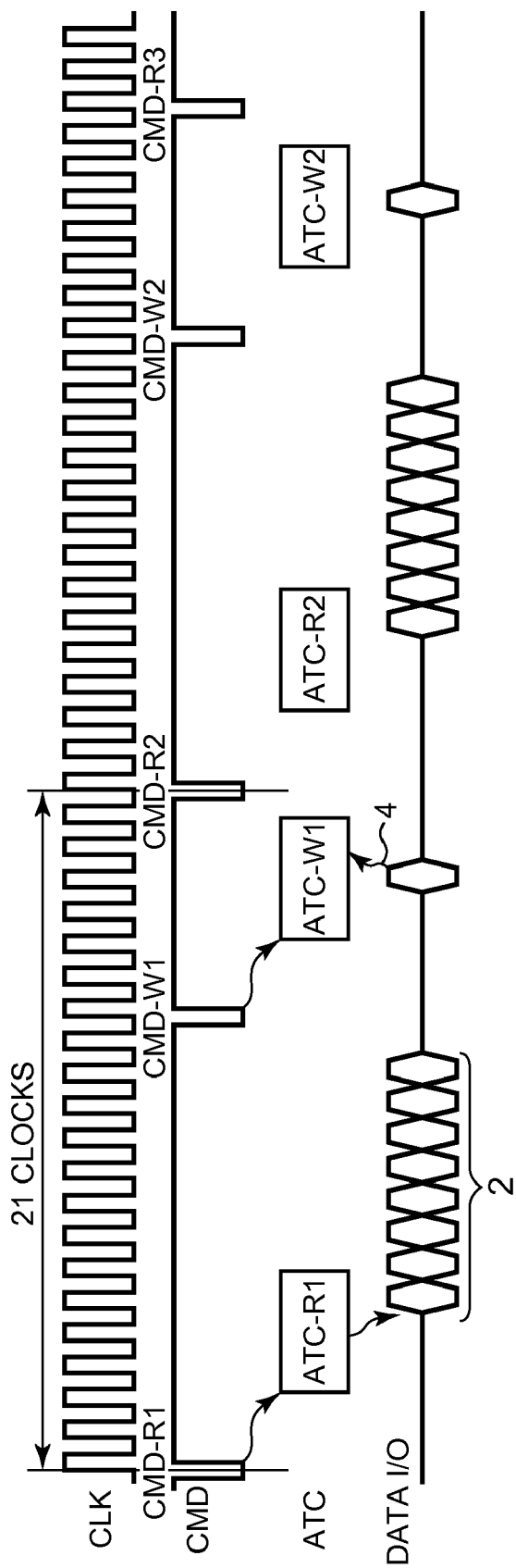
FIG. 1 is a view showing a brief description of reading and writing operations by a conventional typical synchronous PSRAM.

Following are some description of Symbols used in the figures.

2: Reading of burst read data to the data I/O
4, 12: Writing of a single write data into a memory cell
10: Latching of single write data from the data I/O Embodiments of a method of controlling a memory and a memory system in the present invention will be described with reference to the drawings. In order to describe the contents of the present invention more clearly, there will be provided descriptions below with reference to and in comparison with examples of prior arts (drawings) as required. As a cause for a low data rate (a usage rate of a data I/O), it may be cited that both reading (CMD-R) and writing (CMD-W) start after the previous operation is completed. Further, as another cause, it may be also cited that both the read latency (5 clocks) and the write latency (4 clocks) are long. In the prefetch system, the ATC is short and thus an operation (activation) of a memory array is terminated in a short period of time. Therefore, during a burst read, only a latching circuit in which data is prefetched and an off chip driver (OCD) are operating. Moreover, since in the ATCs of the reading and writing operations, each operation starts with each other after the previous operation is terminated, the two ATCs (for example, ART-R1 and ATC-W1) are temporally isolated.

However, if ATCs for reading and writing operations do not overlap, a part of both operations can be overlapped (simultaneous parallel operations). In particular, even if a writing ATC comes up during a burst read, these operations can perform simultaneous parallel operations. Therefore, it is possible to accelerate the start of the writing operation so that the ATC for writing may come up during the burst read, and to overlap these two operations (R & W). However, even if the writing CMD is merely introduced early, but if the next ATC for reading is kept from overlapping, the writing operation, a spare time grows longer in the data I/O, failing in reaching an increase in speed (improvement in a data rate).

Next, with regard to latency, at the time of reading, an address bus operates after input of a command, and thereby, an address is decoded and after an access operation (activation) of an array, the data is read. Therefore, reading latency represents the time for the first data to come up on the data I/O from the CMD, and it is extremely difficult to reduce the time. Also, at the time of writing, a time from when an array starts its operation until when a bit switch is turned on is the same as that for reading. Therefore, writing latency is usually selected so as to be just ready in the time of enabling to turn on the bit switch. Conversely, the writing latency should never be later than the timing of turning on the bit switch, however, it is possible to download a data and hold the data in latching at the earlier moment. In addition, the data writing into a memory cell is performed when the array operation reaches the timing of turning on the bit switch, and thereby, the latency can be reduced before inserting the data. That's the knowledge that the present inventors have newly discovered, and based on this knowledge, a method of controlling a memory and a memory system have been newly created. Further, details of the present invention will be described below.

Figure 2:
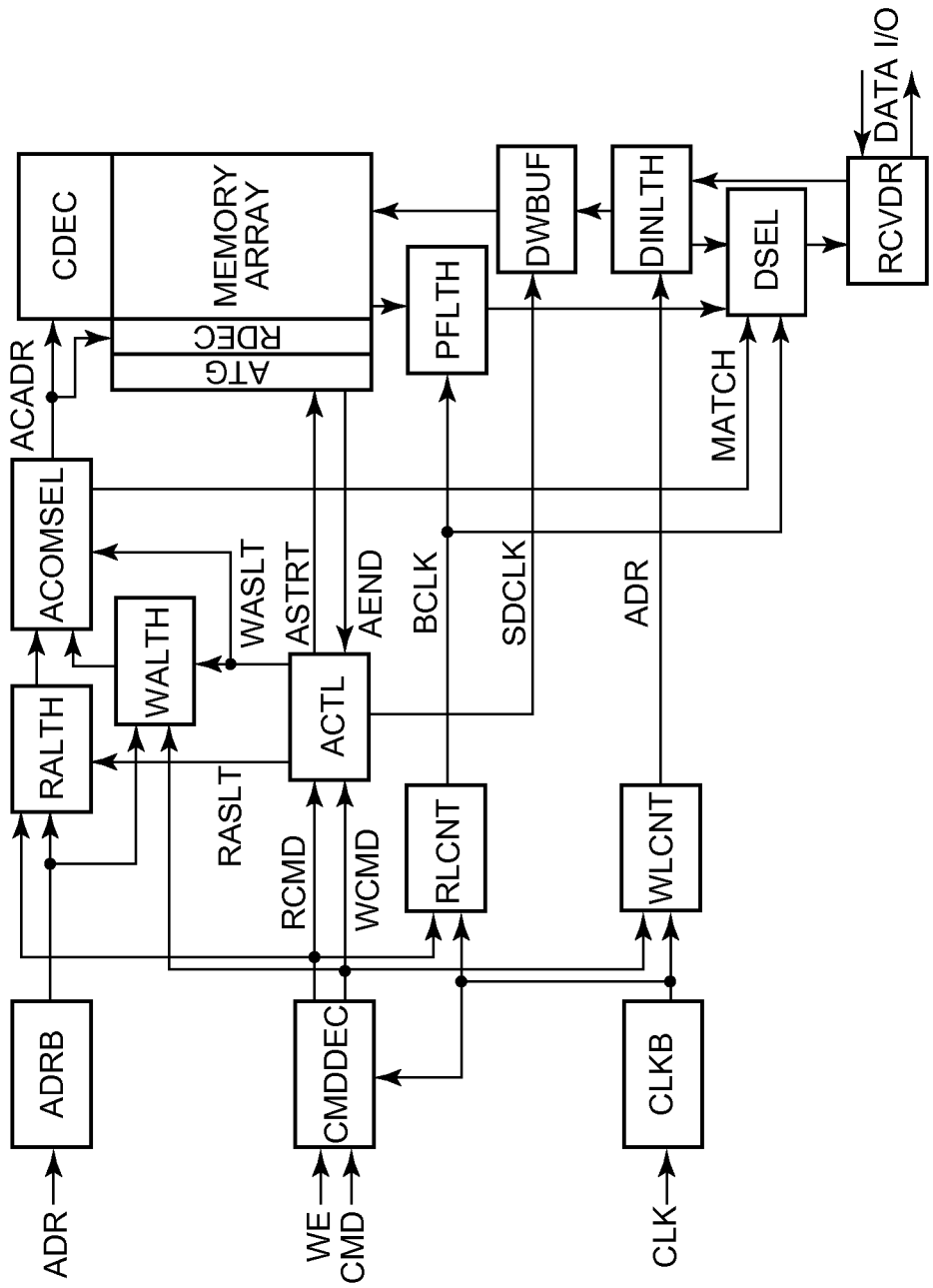
FIG. 2 is a block diagram showing a configuration of a memory system according to embodiments of the present invention.

FIG. 2 is a block diagram illustrating the configuration of a memory system according to embodiments of the present invention. Each block will be described below.

An ADRB represents an address buffer, which receives an address input signal (ADR) and outputs the inputted address to a RALTH or a WALTH.

A RALTH represents a read address latching, which receives a read command (RCMD) and latches the read address sent from an ADRB. Further, a RALTH receives a RASLT signal from an ACTL and outputs an address to be actually accessed to an ACOMSEL.

A WALTH represents a write address latching, which receives a write command (WCMD) and latches a write address sent from an ADRB. Further, the WALTH receives a WASLT signal and outputs an address to be actually accessed to the ACOMSEL.

The ACOMSEL represents an address comparator & selector, which receives a WASLT signal from the ACTL, determines whether the signal is either for reading or writing, and outputs any one of the addresses from the RALTH and the WALTH to a CDEC (Column Address Decoder) and a RDEC (Row Address Decoder) as addresses to be actually accessed (ACADR: Access Address). Further, when the read command (RCMD) comes right after the write command (WCMD), the ACOMSEL compares the write address with the read address. And, when the write address is included in the read address, the ACOMSEL sends a MATCH signal to a DSEL as a signal of summating a signal indicating that the write address is included in the read address and a binary signal of multiple bits indicating that the matched address corresponds to something of a clock of the burst reading.

An ATG represents an array timing generator, and the ATG, receiving an ASTRT (Access Start) signal from an ACTL, starts access to the memory array, and generates timing control signals for a series of memory arrays such as activation of the selected word line, driving of a sense amplifier, precharging thereof or the like. Further, the ATG sends an access end (AEND) signal (low when the array starts accessing, and high when finishes accessing) to the ACTL.

A CMDDEC represents a command decoder, and the CMDDEC, receiving a write enable (WE) signal and a command input (CMD) signal, outputs a read command (RCMD) signal or a write command (WCMD) signal.

An ACTL represents an array controller, and the ACTL, receiving a RCMD signal or a WCMD signal, if the AEND signal from the ATG is high, immediately outputs the ASTRT to the ATG. When the AEND is low, the ACTL waits until the AEND comes back to high and then sends the ASTRT to the ATG. The ACTL sends either one of the address selection signals (RASLT or WASLT) to either the RALTH or the WALTH simultaneously with the ASTRT signal depending on either reading or writing, and determines the address to be accessed. In writing, after the ASTRT signal is generated, the ACTL sends a write driver enable (WDRE) signal to a DWBUF at an appropriate timing to start data writing into the memory cell.

A CLKB represents a clock buffer, and the CLKB sends a clock signal (CLK) received to a WLCNT, a CMDDEC and a RLCNT.

The RLCNT represents a read latency counter, and the RLCNT, receiving the RCMD, counts the number of latency clocks at the time of a reading operation. Thereafter, the RLCNT sends the clocks of the number of burst words (BCLK: Burst Clock) to a PFLTH at the given timing (a number of clocks) to drive reading in a burst mode.

A WLCNT represents a write latency counter, and the WLCNT, receiving the WCMD, counts the number of latency clocks at the time of a writing operation. Then, the WLCNT sends a SDCLK (single data clock) signal to a DINLTH at the given timing (number of clocks) to latch the write data inputted in a RCVDR in a DINLTH.

A PFLTH represents a prefetch latching, and the PFLTH, latching read data of the number of the burst words at once, receives a BCLK signal from the RLCNT and sends the data to the RCVDR sequentially.

The RCVDR represents a data receiver and driver, and the RCVDR, receiving a write data from a data input and output signals (data I/O), sends a read data from the memory cell to the data I/O.

The DINLTH represents a data input latching, and the DINLTH, receiving a write data from the RCVDR, sends the data to a DWBUF and a DSEL.

The DSEL represents a data selector, and the DSEL usually sends data from the PFLTH as-is, however, when there is a MATCH signal sent from a ACOMSEL, the DSEL replaces only a read data of a burst clock specified by the MATCH signal by the write data latched in the DINLTH.

A DWBUF represents a data write buffer, and the DWBUF has the function as a driver of latching a write data from the DINLTH and writing the data into the memory cell.

Next, a method of controlling a memory according to one embodiment of the present invention will be described.

(A) In Case of Performing a Writing Operation Before a Read Data Comes Up on the Data I/O.

Figure 3:
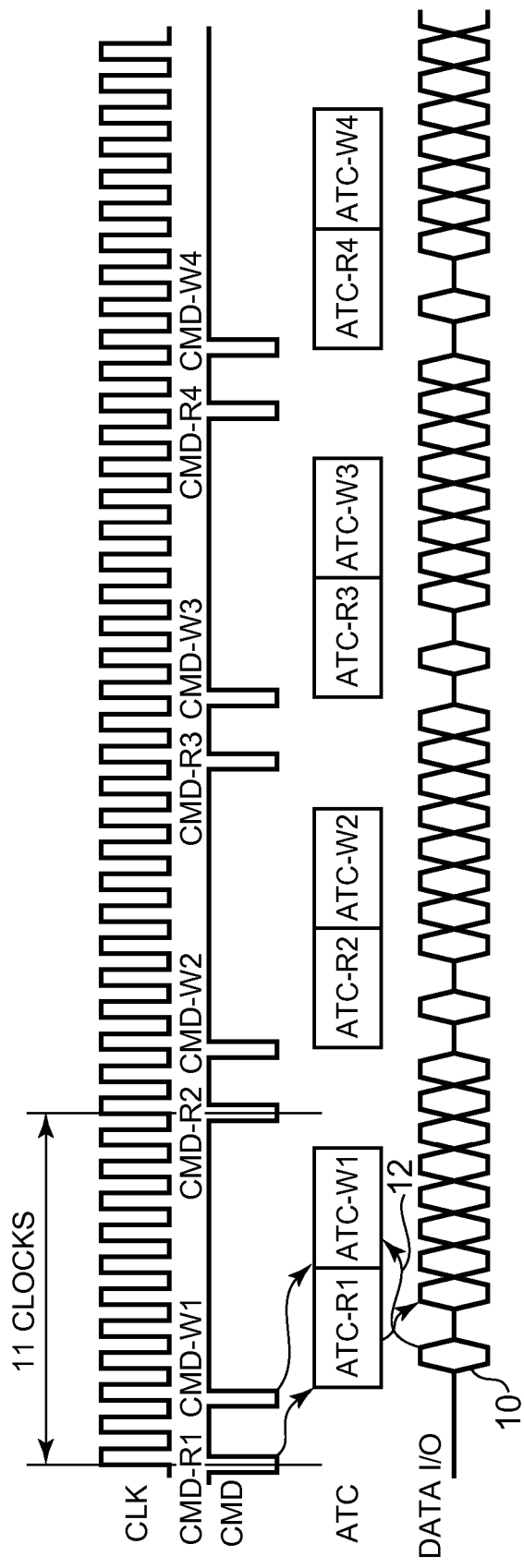
FIG. 3 is a view showing a brief description of a timing of reading and writing operations according to embodiments of the present invention.

This operation mainly occurs when a plurality of processors chiefly access to a common memory. FIG. 3 shows a rough description of reading and writing operations. Since the meanings of the ATC, data I/O or the like in FIG. 3 are the same as those in FIG. 1, those being given in FIG. 1 is directly quoted. Reading is performed at the same timing as the prior art in FIG. 1. In other words, a time from the CMD-R to start of the ATC and reading latency (5 clocks) are the same as those in FIG. 1. The CMD-W is inserted in the second clock from the CMD-R, and further a timing of data insertion is also advanced earlier, and the latency is inserted at 1 clock. However, even if the CMD-W is inserted early, the ATC-W thereof is put on stand-by until the ATC-R of the previous CMD-R is terminated. A single write (one word) data that is inserted earlier is also held in latching and is written into a cell at the appropriate timing pending the ATC-W for writing.

In this operation mode, the time between the ATC of reading and the ATC of writing is minimized so that the ATCs may not overlap each other (consecutively follow), writing latency is advanced early, and further, a write data is downloaded from the data I/O before the first read data comes up on the data I/O by using the fact that reading latency cannot be reduced. As shown in FIG. 3, the number of clocks per one cycle of a set of reading and writing (for example, CMD-R1 and CMD-W1) is reduced to 11 clocks from 21 clocks per cycle in the prior art in FIG. 1. Within this cycle time, 9 clocks of the data I/O are used, and the usage rate thereof is 82% (9/11). This shows that the data rate is increased nearly by two times as much as 43% (9/21) of the prior art being shown in FIG. 1. In the example in FIG. 3, a space for one clock is intentionally provided (OCD) between reading and writing of an off chip driver for the purpose of preventing a read data and a write data from coming together due to switching between a driver and a receiver. However, the space of one clock is not required for an open drain system being pulled up outside a memory. As a result, the usage rate of the data I/O ends in 100%, enabling to increase a substantial data rate to the theoretical maximum value.

Figure 4:
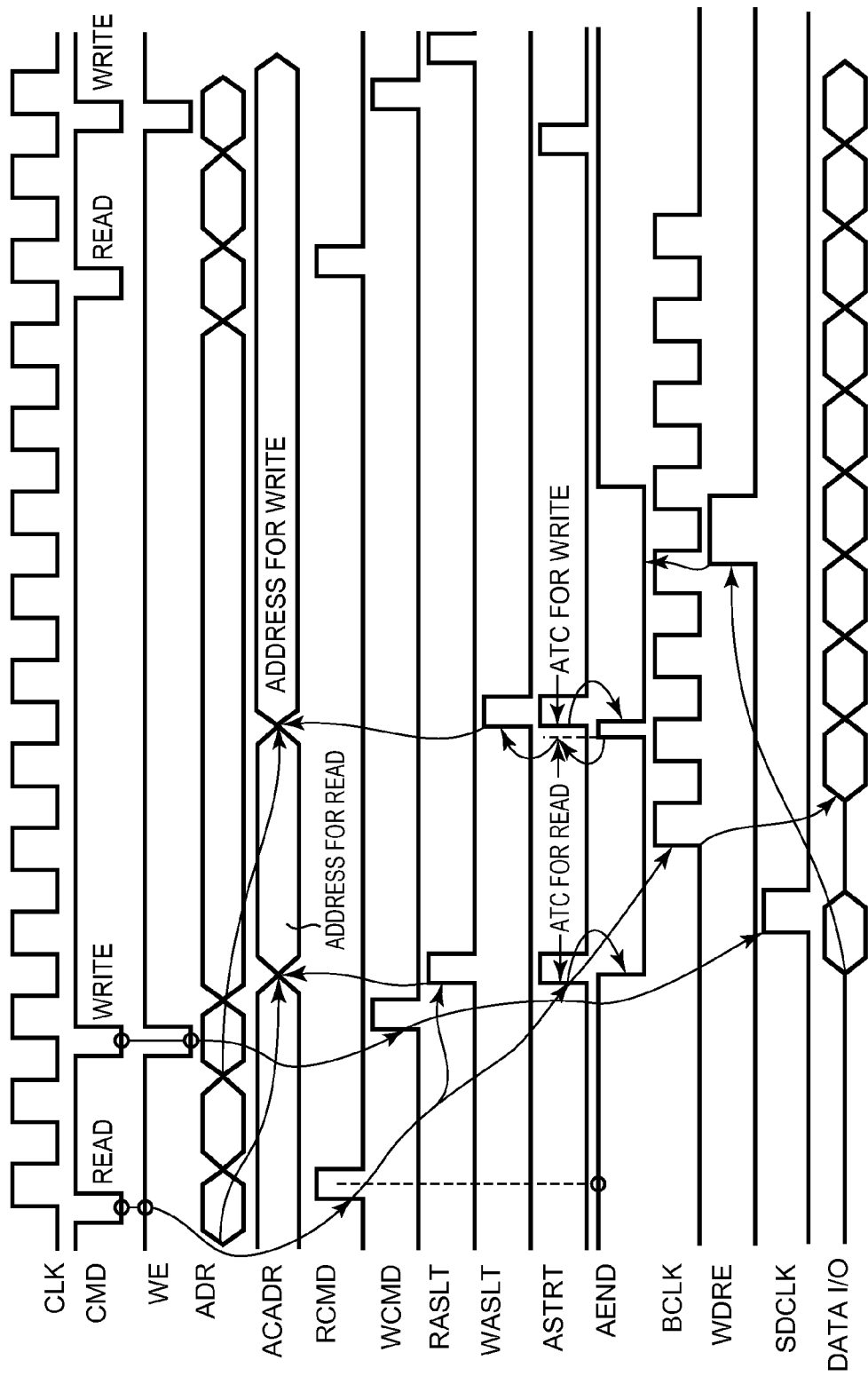
FIG. 4 is a view using the system shown in FIG. 2, and showing a timing of reading and writing operations of embodiments of the present invention shown in FIG. 3.

FIG. 4 shows an operation timing in case that the memory system in FIG. 2 is used. Since a CMD signal is low and a WE signal is high in the first CLK signal, the CMDDEC recognizes the signal to be for reading, and thereby, outputs a RCMD signal (high) to latch the read address thereof in a RALTH. Receiving a RCMD signal (high), the ACTL immediately sends out a RASLT signal (high) and an ASTRT signal (high) since the AEND signal is high after a delay of an address circuit. Accordingly, an access to a read address of the memory array starts. An ATG performs timing control of a series of operations within the memory array, and latches a burst word length of data in a PFLTH. A RLCNT counts the number of clocks from the RCMD signal (high) and sends a BCLK signal to the PFLTH so that the first data may come up on the data I/O after the read latency. The BCLK signal contains a burst word length of the number of clocks (in this case, 8 clocks), and outputs a burst read data from the PFLTH to the data I/O.

On the other hand, since a WE signal and a CMD signal become low in the third CLK signal, a CMDDEC recognizes the signal to be for writing and thus outputs a WCMD signal (high) to latch the write address thereof in a WALTH. Here, as in the case of reading, an access to the memory array is going to be started. However, since the memory array is currently activated due to the previous reading operation and thus an AEND signal is low at this point, the start of read access is kept on hold. Once the AEND signal comes back to high, then an ASTRT signal (high) and a WASLT signal (high) are outputted and a write access to the memory array is started. In response to the WCMD signal (high), a WLCNT downloads a single write data from the data I/O and latches the data in a DINLTH by a SDCLK signal (high). The latched single write data is written into the memory array by a WDRE signal (high) from an ACTL.

(B) In Case of Keeping Writing on Hold Until a Burst Read Data Output is Terminated.

In FIGS. 3 and 4, it is illustrated that a data rate is improved in case of substantially repeating reading and writing by inserting a single write operation during read latency. In this example, writing is performed before read data comes up, and this method is effective when a plurality of processors access to a common memory. Meanwhile, in case of a single processor, it is often the case that writing comes after burst read is terminated. The present invention can correspond to this operation mode, too.

Figure 5:
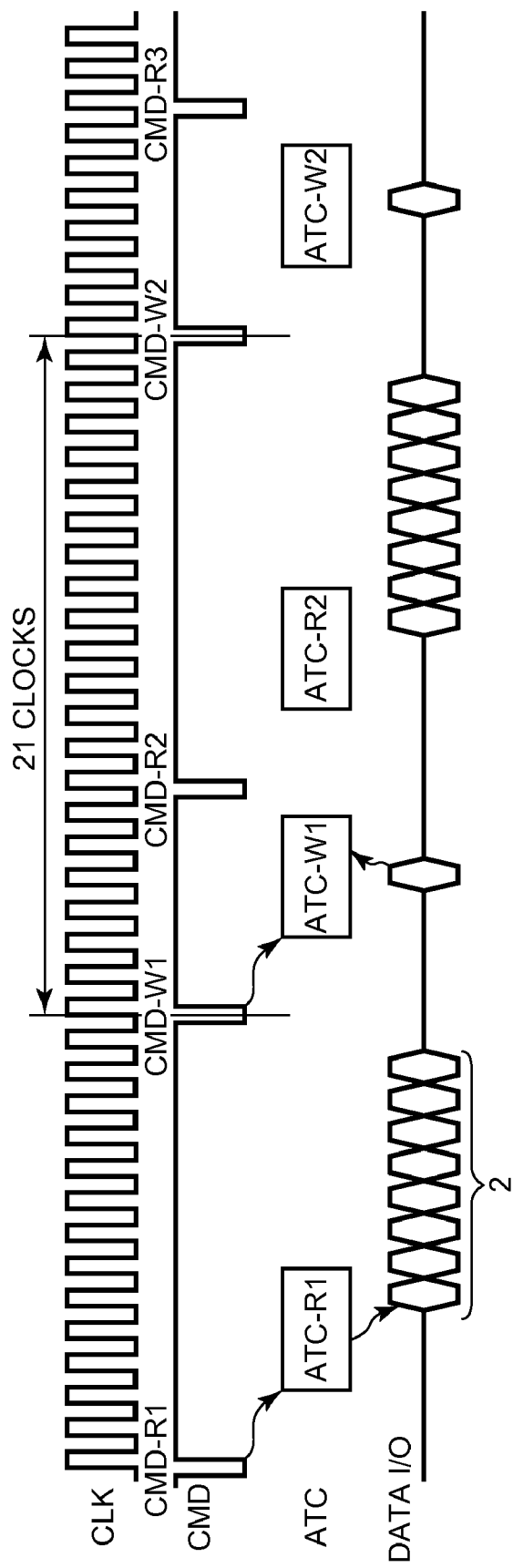
FIG. 5 is a view showing a brief description of reading and writing operations by a conventional typical synchronous system, a PSRAM.
Figure 6:
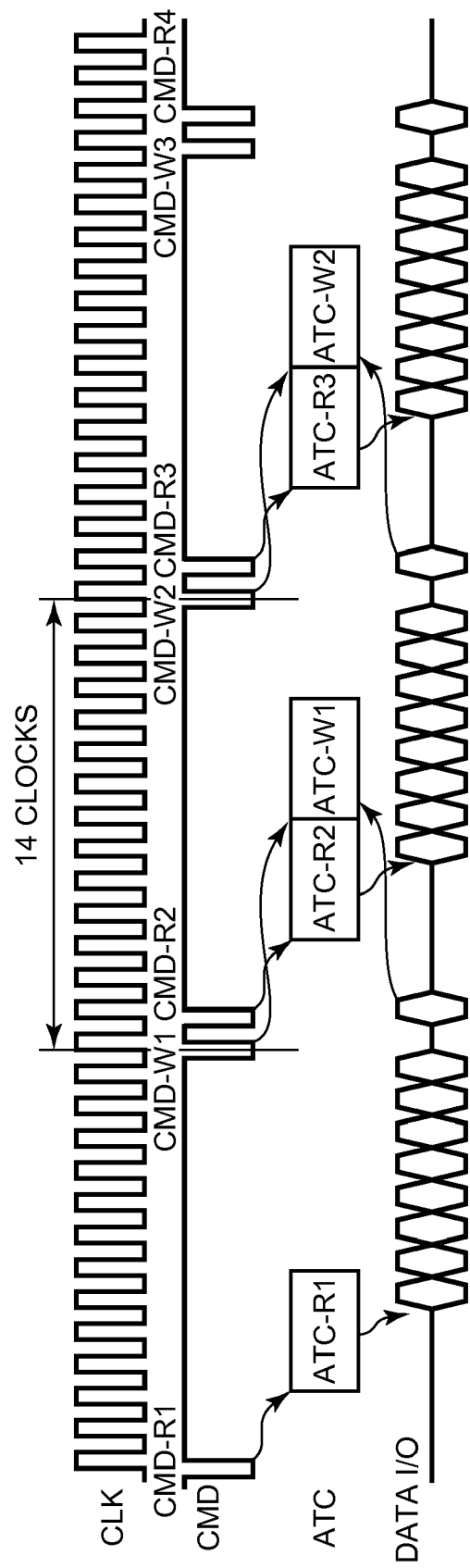
FIG. 6 is a view showing a brief description of a timing of reading and writing operations according to embodiments of the present invention.

FIG. 5 is the same as FIG. 1 illustrating a conventional operation timing, however, it is again shown for the purpose of comparison. A write command (CMD-R) comes after burst read, and a cycle time of repeating reading and writing operations (between a CMD-W1 and a CMD-W2 in FIG. 5) requires 21 clocks. FIG. 6 shows a brief description of an operation timing based on the present invention. After the first burst read (CMD-R1) is terminated, a write command for a single write (CMD-W1) comes in. And, the write data is immediately downloaded to a DINLTH. However, according to the present disclosure, in order to improve a data rate, a read command (CMD-R2) is inserted at the next clock. When reading comes right behind a write command, for example, to the first clock, as stated above, activation of a memory array is reversed to give priority to activation of the memory array for reading (ATC-R2). Activation of the memory array for writing (ATC-W1) is performed after the activation of the memory array for reading (ATC-R2) is terminated. Since, by doing this, activation of a write array is performed during a burst read, the cycle time of repeating reading and writing (for example, a time between a CMD-W1 and a CMD-W2 in FIG. 6) is reduced to 14 clocks. This results in improvement in a data rate by 33% compared with the prior art in FIG. 5.

This operation mode is practicable according to the configuration shown in FIG. 2. However, in case that a read command comes to an ACTL within a given period of time (for example, within one clock) after a write command, it is necessary to provide the ACTL with a function to hold writing and give priority to reading. In other words, the ACTL makes a RASLT signal to be high on ahead to activate an array, and makes the array to perform a reading operation in a read address. After termination thereof, once receiving an AEND signal (high) from an ATG, the ACTL makes a WASLT signal to be high and makes an array access for writing to start.

Figure 7:
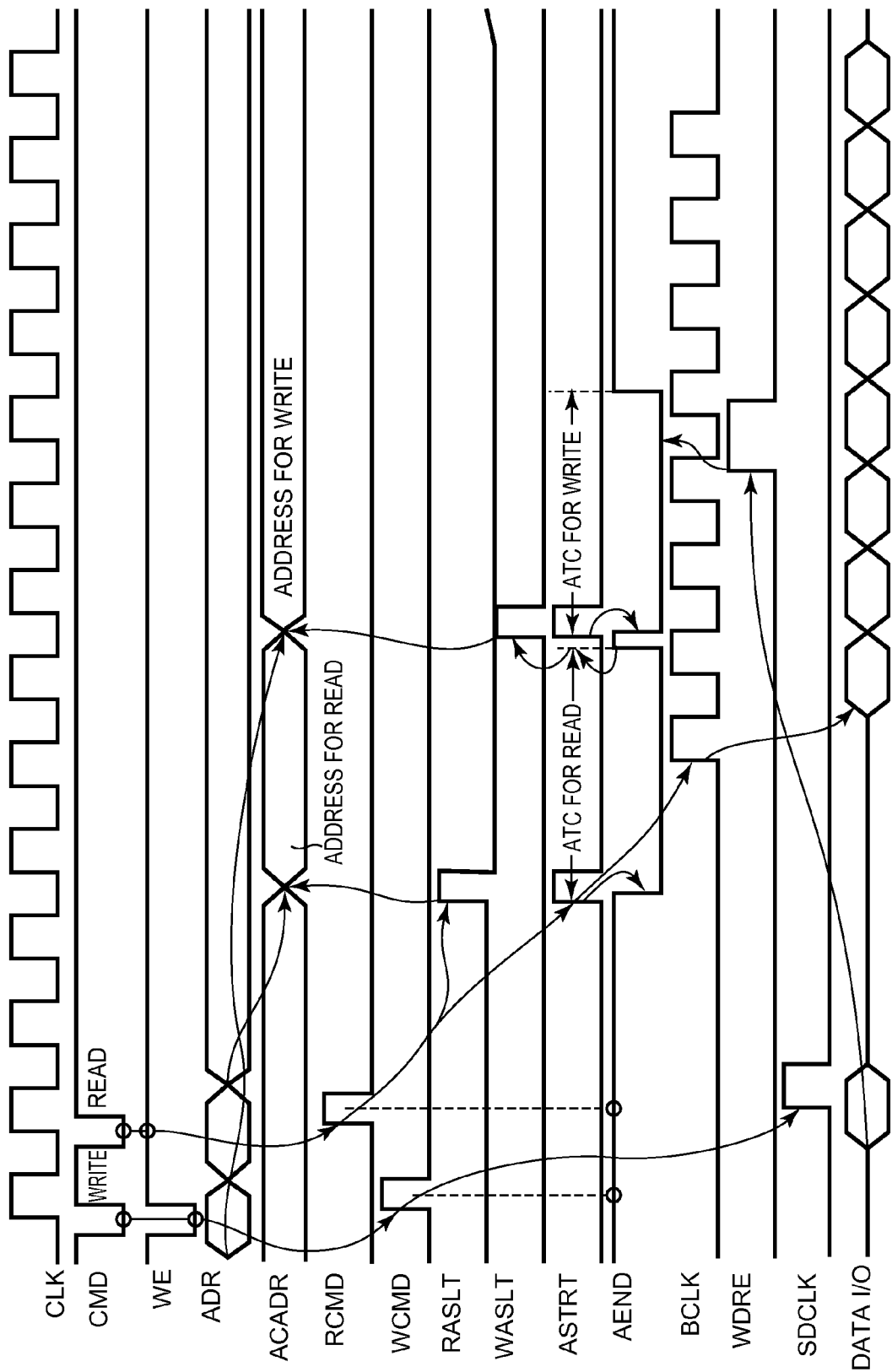
FIG. 7 is a view using the system shown in FIG. 2, and showing a timing of reading and writing operations of embodiments of the present invention showing in FIG. 6.

FIG. 7 shows an operation timing in case that the memory system shown in FIG. 2 is used. Since a CMD and a WE are low at the first CLK, a CMDDEC recognizes the command to be for writing, and outputs a WCMD signal (high) to latch a write address in a WALTH. Also, by a SDCLK signal (high), a single write data is latched in a DINLTH from the data I/O. Since a CMD is low and a WE is high at the second clock, a CMDDEC recognizes the command to be for reading, and latches a read address in a RALTH by a RCMD signal (high). At the same time, an ACTL prioritizes reading over writing, and immediately outputs a RASLT signal (high) and an ASTRT signal (high), since an AEND signal is high. Thereafter, an access to a read address of the memory array starts. An ATG controls timing signals for a series of operations within the memory array and latches a burst word length of a read data in a PFLTH. A RLCNT counts the number of clocks from a CMD and sends a BCLK signal to the PFLTH so that the first data may come up on the data I/O after read latency. The BCLK signal contains a burst word length of the number of clocks (8 clocks in this case), and the PFLTH outputs a burst read data to the data I/O.

Once the read access is terminated, an AEND signal (high) enters in an ACTL. Determining that the next array access can be started, the ACTL outputs a WASLT signal (high) and an ASTRT signal (high), and starts the array access having been held. The ACTL sends a WDRE signal (high) to a DWBUF and writes the latched write data into an array. Since activation of a write array (ATC for write) is performed in parallel during burst read, it is not necessary to newly add the activation to a single cycle time of reading and writing.

As shown in FIG. 6, when reading comes immediately after writing, a reading operation comes first in an array operation. Therefore, if a write address matches a part of a read address, a read data will become a data before writing. In this case, the operation will deviate from an operation being called for on a general memory in which, even if the data is read right after the writing, it is regarded as natural that the data written first comes up. As means for avoiding the deviation, such means is used in which, since a written data is latched, addresses are compared at the time of reading, and if there is any matched address, the matched address is obtained from the latched data instead of an array to use the same as a read data.

This operation will be described with an example where reading is performed with 8-word burst, using the memory system configuration shown in FIG. 2. When reading comes right after writing, an ACOMSEL checks (compares) whether the 8-word read address includes the previous write address. The ACOMSEL then sends, to a DSEL, a MATCH signal containing 4-bit signal in total that is made of a signal indicating that the write address is included in the read address, and a 3-bit signal indicating what number clock of the 8-word burst read the matched address is. In a DSEL, only the data in the burst number specified by the MATCH signal within the 8-word read data from the PFLTH is replaced by the latched data from a DINLTH, and the rest is directly outputted to a RCVDR. As shown in FIG. 7, the write data, after activation of the array at the write address, is written into the memory array from a DINLITH via a DWBUF during the burst read.

(C) In Case of Repeating a Single Write Operation.

Figure 8:
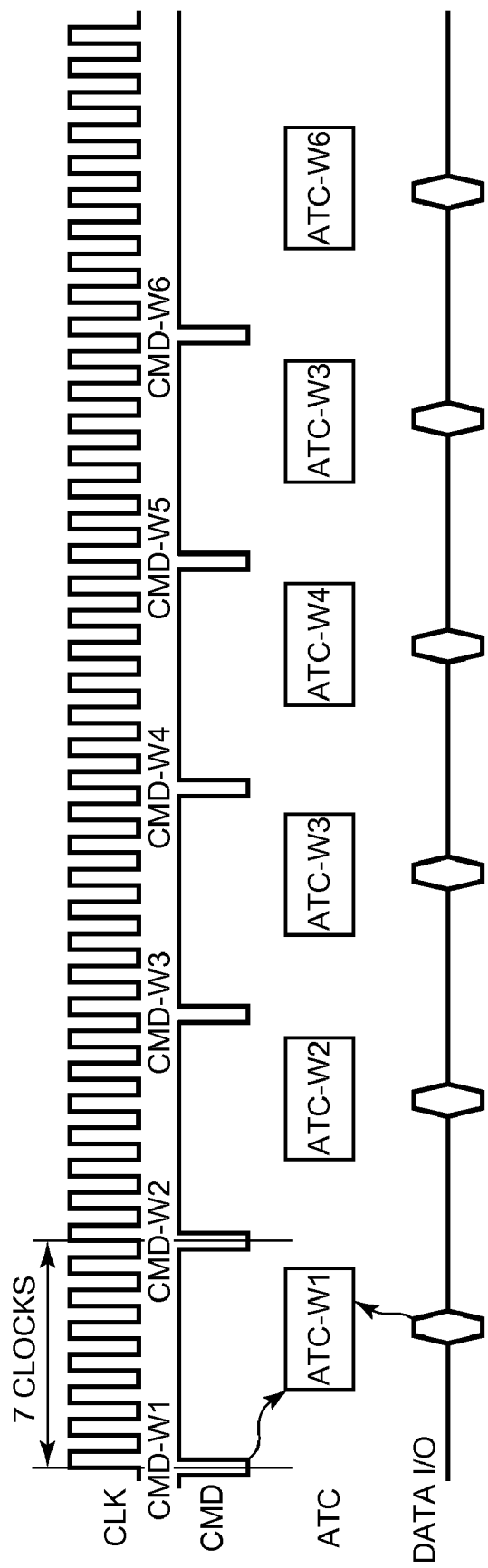
FIG. 8 is a view showing a brief description of a conventional single write operation.
Figure 9:
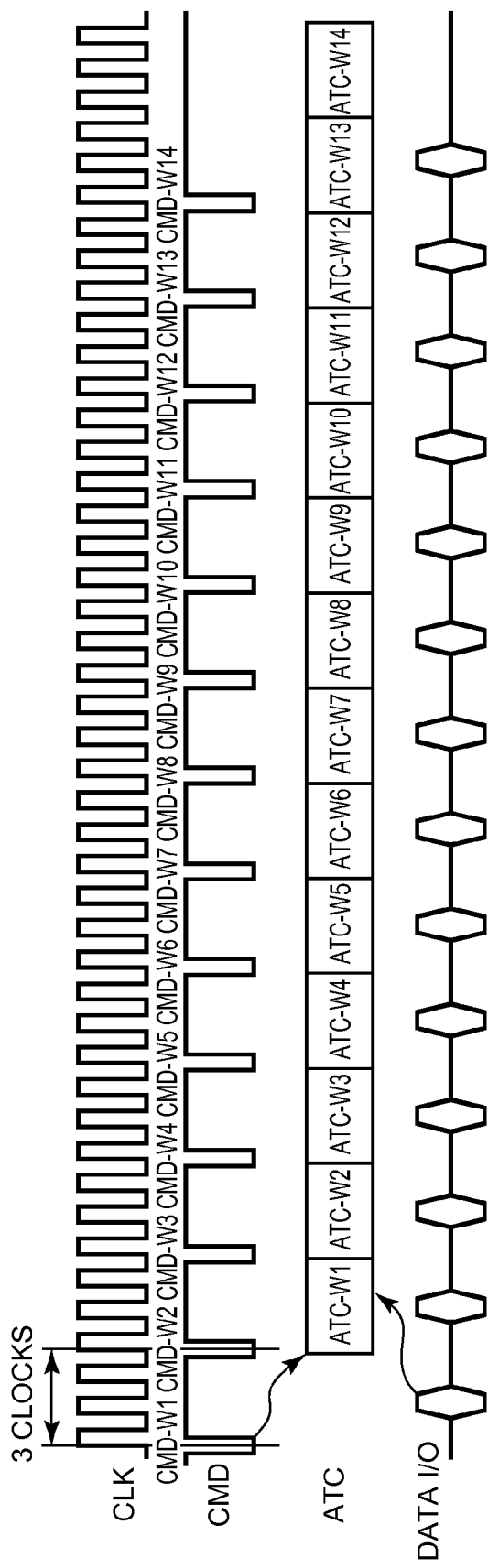
FIG. 9 is a view showing a brief description of a timing of a single write operation according to embodiments of the present invention.

FIG. 8 will illustrate a brief description of an operation timing of continued single write operations by a conventional typical PSRAM. FIG. 9 will show a brief description of an operation timing of continued single write operations according to the present invention. In FIG. 9, a time from a write command (CMD-W) to activation of an array (ATC-W) is the same as the time thereof in the conventional case shown in FIG. 8. Meanwhile, in FIG. 9, write latency is changed to a clock, same as in FIG. 3. Further, by minimizing the operation time (making the operation time to consecutively follow) so that an ATC-W of each command (CMD-W) may not overlap, a cycle between two commands can be reduced from conventional 7 clocks to 3 clocks, and the data rate is improved by more than double.

Figure 10:
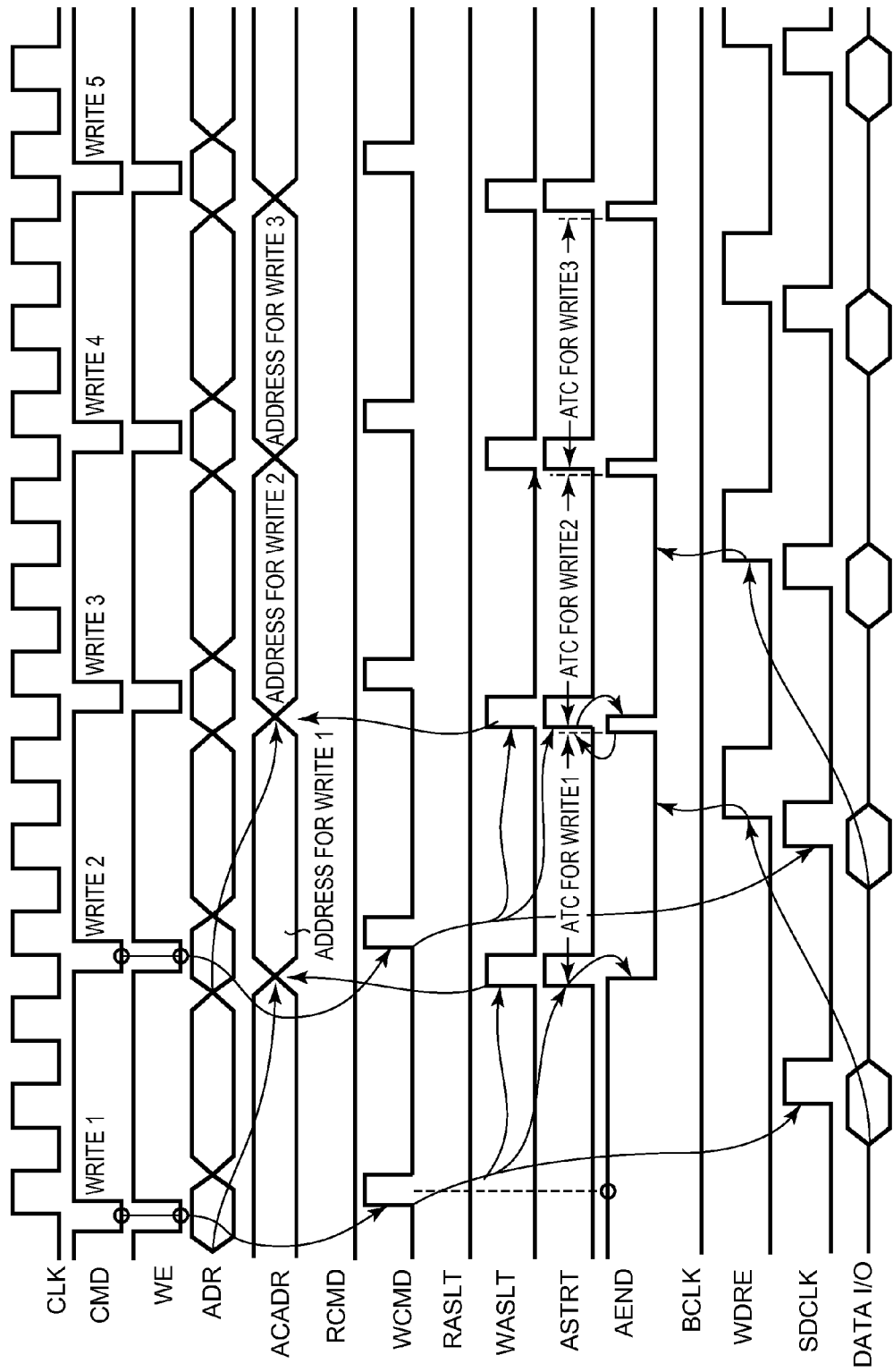
FIG. 10 is a view using the system shown in FIG. 2, and showing a timing of reading and writing operations of embodiments of the present invention shown in FIG. 9.

FIG. 10 shows an operation timing in case that the configuration shown in FIG. 2 is used. Since a CMD signal and a WE signal are low at the first CLK, a CMDDEC recognizes the command to be for writing to output a WCMD signal (high), and then latches a write address in a WALTH. A WLCNT receives a WCMD signal (high) and sends a SDCLK signal (high) to the DINLTH. Thereafter, the data after write latency is downloaded from the data I/O and latched in the DINLTH. Receiving the WCMD signal (high), an ACTL, after delaying an address circuit, immediately outputs a WASLT signal (high) and an ASTRT signal (high), since an AEND signal is high, and starts an access to the write address of the memory array. The write data being latched in the DINLTH is written into the memory array, receiving a WDRE signal (high) from the ACTL.

In the above stated embodiments, the present invention was described with an example of a PSRAM mainly based on a DRAM. However, not limited to this example, the present invention is applicable to all kinds of memory systems having memory cell array configuration including other types of semiconductor memories. In this case, "activation of a memory array (cell)" referred to by the present invention means to let a memory array (cell) of an address to be accessed into being literate.

What is claimed is:

1. A method of controlling a memory, said memory including a memory cell array and being connected to an address input and a data input/output, the method comprising the steps of:
   receiving a read address from the address input;
   receiving a write address from the address input;
   latching a single write data to be written into a memory cell corresponding to said write address from the data input/output;
   activating a memory cell corresponding to said read address;
   outputting a read data from said activated memory cell to said data input/output;
   activating the memory cell corresponding to said write address during outputting said read data to said data input/output;
   writing said latched single write data into said activated memory cell corresponding to said write address;
   comparing said write address with said read address; and
   replacing, if said write address matches a part of said read address, a read data of said matching address out of said read data by said latched single write data.

2. The method according to claim 1, wherein the step of activating the memory cell corresponding to said write address starts so as to consecutively follow the activation of the memory cell corresponding to said read address.

3. The method according to claim 1, wherein said read data is a burst read data, and the step of outputting the read data from said activated memory cell to said data input/output includes the steps of:
   prefetching a read data from said activated memory cell; and
   outputting said prefetched read data to said data input/output.

4. A method of controlling a memory, said memory including a memory cell array and being connected to an address input and a data input/output, the method comprising the steps of:
   receiving a write address from said address input;
   latching a single write data to be written into a memory cell corresponding to said write address from said data input/output;
   receiving a read address from said address input;
   activating a memory cell corresponding to said read address;
   outputting a read data from said activated memory cell to said data input/output;
   activating the memory cell corresponding to said write address while outputting said read data to said data input/output;
   writing said latched single write data into the activated memory cell corresponding to said write address;
   comparing said write address with said read address; and replacing, if said write address matches a part of said read address, a read data of said matching address out of said read data by said latched single write data.

5. The method according to claim 4, wherein the step of activating the memory cell corresponding to said write address starts so as to consecutively follow the activation of the memory cell corresponding to said read address.

6. The method according to claim 4, wherein said read data is a burst read data, and the step of outputting the read data from said activated memory cell to said data input/output includes the steps of:
  prefetching a read data from said activated memory cell; and
  outputting said prefetched read data to the data input/output.

7. The method according to claim 6, further comprising the steps of:
  comparing said write address with said read address; and
  replacing, if said write address matches a part of said read address, a read data of said matching address out of said prefetched burst read data by said latched single write data.

8. A memory system including a memory cell array and being connected to an address input, a command input, and a data input/output, said memory system comprising:
  a latching circuit for latching a read address and a write address inputted from the address input;
  an address selection circuit for selecting, as an access address, any one of the read address and the write address latched in the latching circuit;
  a read latching circuit for latching read data read from the memory cell array;
  a write latching circuit for latching write data inputted from the data input/output;
  a control circuit for controlling the access address selected by said address selection circuit in response to a command inputted from said command input, said control circuit further controlling a timing of activating a memory cell corresponding to said selected access address, and also a timing of writing the write data latched by said write latching circuit to the activated memory cell in case that said selected access address is a write address; and
  a data selection circuit,
  wherein said address selection circuit compares said latched write address with a read address, and outputs a matching signal if the write address matches a part of the read address and, in response to the matching signal, said data selection circuit replaces a read data of the read address matching said write address out of the read data being outputted from said read latching circuit, by a write data being latched in said write latching circuit.

9. The memory system according to claim 8, further comprising a timing circuit for controlling a timing of activating a memory cell corresponding to the access address being selected by said address selection circuit under control of said control circuit.

10. The memory system according to claim 9, wherein said control circuit, in case that a write command is received within a given period of time after receiving a read command from said command input, controls said address selection circuit and said timing circuit so that activation of a memory cell corresponding to a write address can be performed consecutively following the activation of a memory cell corresponding to a read address.

11. The memory system according to claim 8, wherein said read data is a burst read data and said write data is a single write data.

12. The memory system according to claim 8, further comprising a read counter for controlling a timing for said read latching circuit to latch a read data from a memory cell and to output said latched read data to said data input/output, in response to a clock signal from outside and a read command being inputted from said command input.

13. The memory system according to claim 8, further comprising a write counter for controlling a timing for said write latching circuit to latch a write data from said data input/output in response to a clock signal from outside and a write command inputted from said command input.

14. The memory system according to claim 8, further comprising a write driver for receiving a write data from said write latching circuit and writing said received write data into said activated memory cell under control of said control circuit.

15. The memory system according to claim 8, comprising:
  a read latching circuit for latching a read address being inputted from said address input, in response to a read command being inputted from said command input; and
  a write latching circuit for latching a write address being inputted from said address input, in response to a write command being inputted from said command input.

16. The memory system according to claim 8, wherein said control circuit, in case that a read command is received within a given period of time after receiving a write command from said command input, renders said address selection circuit to select a read address in preference as an access address.

* * * * *